(12) United States Patent
Liao et al.

(10) Patent No.: US 11,114,412 B2
(45) Date of Patent: Sep. 7, 2021

(54) ELECTRONIC PACKAGE AND METHOD FOR FABRICATING THE SAME

(71) Applicant: Siliconware Precision Industries Co., Ltd., Taichung (TW)

(72) Inventors: Hsin-Yi Liao, Taichung (TW); Cheng-Kai Chang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 16/686,995

(22) Filed: Nov. 18, 2019

(65) Prior Publication Data

US 2021/0104491 A1 Apr. 8, 2021

(30) Foreign Application Priority Data

Oct. 7, 2019 (TW) ................................. 108136264

(51) Int. Cl.
*H01L 25/065* (2006.01)
*H01L 23/31* (2006.01)
(Continued)

(52) U.S. Cl.
CPC ...... *H01L 25/0652* (2013.01); *H01L 21/4853* (2013.01); *H01L 21/56* (2013.01); *H01L 23/3128* (2013.01); *H01L 23/3135* (2013.01); *H01L 23/5385* (2013.01); *H01L 23/5386* (2013.01); *H01L 24/16* (2013.01); *H01L 24/48* (2013.01); *H01L 24/73* (2013.01); *H01L 24/81* (2013.01); *H01L 24/85* (2013.01); *H01L 24/92* (2013.01); *H01L 25/16* (2013.01); *H01L 25/50* (2013.01); *H01L 23/49816* (2013.01); *H01L 24/32* (2013.01); *H01L 2224/16147* (2013.01); *H01L 2224/16227* (2013.01); *H01L 2224/32225* (2013.01); *H01L 2224/48091* (2013.01); *H01L 2224/48106* (2013.01); *H01L 2224/48227* (2013.01); *H01L 2224/73204* (2013.01); *H01L 2224/73207* (2013.01); *H01L 2224/73265* (2013.01); *H01L 2224/92225* (2013.01)

(58) Field of Classification Search
CPC . H01L 25/0652; H01L 21/4853; H01L 21/56; H01L 25/16; H01L 25/50
See application file for complete search history.

(56) References Cited

U.S. PATENT DOCUMENTS

2018/0130781 A1* 5/2018 Kang .................. H01L 25/0652
2020/0020647 A1* 1/2020 Jee ............................ H01L 23/16

* cited by examiner

*Primary Examiner* — Errol V Fernandes
(74) *Attorney, Agent, or Firm* — Mintz Levin Cohn Ferris Glovsky and Popeo, P.C.; Peter F. Corless; Steven M. Jensen (57) ABSTRACT

An electronic package is provided, including: a first carrying structure having a first circuit layer; a package module disposed on the first carrying structure and electrically connected to the first circuit layer; a first electronic component disposed on the first carrying structure and electrically connected to the first circuit layer; and a second electronic component stacked on and electrically connected to the first electronic component. As the second electronic component is stacked with the first electronic component, a surface area of the first carrying structure that the first and second electronic components occupy is reduced, and the electronic package can have sufficient space to accommodate the package modules. A method for fabricating an electronic package is also provided.

20 Claims, 5 Drawing Sheets

(51) Int. Cl.
*H01L 23/538* (2006.01)
*H01L 23/00* (2006.01)
*H01L 21/48* (2006.01)
*H01L 25/00* (2006.01)
*H01L 21/56* (2006.01)
*H01L 25/16* (2006.01)
*H01L 23/498* (2006.01)

ELECTRONIC PACKAGE AND METHOD FOR FABRICATING THE SAME

CROSS-REFERENCE TO RELATED APPLICATIONS

This application claims priority to Taiwan Application Serial No. 108136264, filed on Oct. 7, 2019. The entirety of the application is hereby incorporated by reference herein and made a part of this specification.

BACKGROUND

1. Technical Field

The present disclosure relates to semiconductor packaging processes, and, more particularly, to an electronic package and a method for fabricating the same.

2. Description of the Prior Art

With the rapid development of electronic industry, modern electronic products are produced to be low-profiled and compact-sized and have a variety of functions. Accordingly, different types of packages are introduced in the semiconductor packaging technology. The flip-chip bonding packaging technique is developed to meet the demand for high integration, miniaturization and high circuit performance of semiconductor devices.

According to the flip-chip bonding packaging technique, a plurality of metal bumps are formed on an active surface of a chip (or other semiconductor structures), and the active surface of the chip is electrically connected via the metal bumps to an external electronic device or a package substrate, to greatly reduce the volume of the package.

Figure 1A:
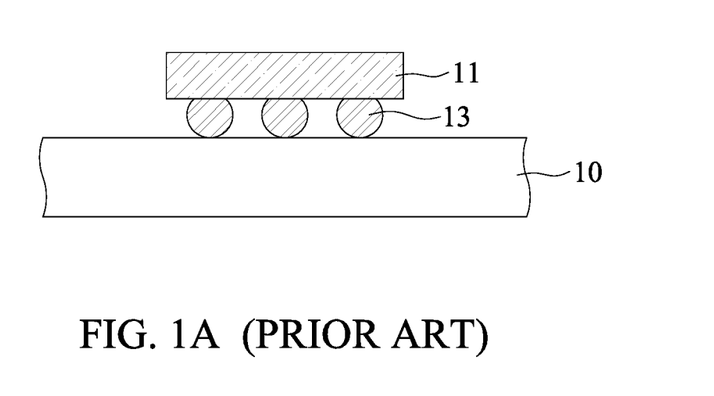
FIGS. 1A and 1B are cross-sectional views illustrating a method for fabricating a flip-chip semiconductor package according to the prior art.
Figure 1B:
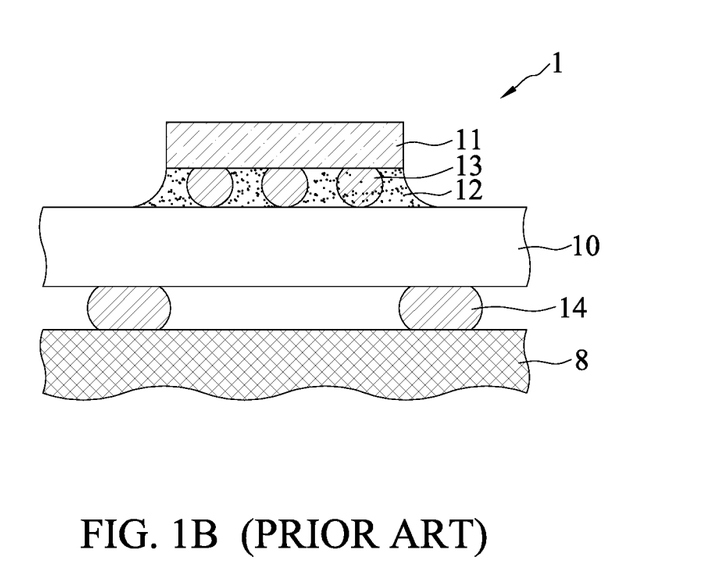

As shown in FIGS. 1A and 1B, in a method for fabricating a flip-chip semiconductor package 1 according to the prior art, a semiconductor chip 11 is bonded to a package substrate 10 via a plurality of solder bumps 13, an underfill 12 is formed between the semiconductor chip 11 and the package substrate 10 and encapsulates the solder bumps 13, and a plurality of solder balls 14 are implanted on a lower side of the package substrate 10 for a major board 8 of an electronic product to be mounted thereon.

However, in the semiconductor package 1 according to the prior art, a great number of the semiconductor chips 11, if disposed on a surface of the package substrate 10 horizontally at the same time, will occupy too great the area of the package substrate 10, and the remaining area is not big enough to accommodate other package modules. On the other hand, if the surface area of the package substrate 10 is increased to accommodate the other package modules, the volume of the semiconductor package 1 is increased accordingly, which is contradictory to the trend of low profile and compact size.

According to the prior art, the package substrate 10 is a general organic substrate or a core substrate. Due to the limited manufacturing process of the package substrate 10, only circuits of the same line width/line pitch can be fabricated. As such, it is difficult to simultaneously meet different circuit specifications required by different electronic components. For example, micronized functional chips are required to dispose on circuits with fine line width/line pitch specification, and power ports and ground ports are required to form on circuits with large line width/line pitch specification.

Therefore, how to solve the problems of the prior art is becoming an urgent issue in the art.

SUMMARY

In view of the problems of the prior art, the present disclosure provides an electronic package, comprising: a first carrying structure defined with a first surface and a second surface opposing the first surface and having a first circuit layer; a package module disposed on the first surface of the first carrying structure and electrically connected to the first circuit layer; a first electronic component disposed on the first surface of the first carrying structure and electrically connected to the first circuit layer; and a second electronic component stacked on and electrically connected to the first electronic component.

The present disclosure also provides a method for fabricating an electronic package, comprising: providing a first carrying structure having a first circuit layer and defined with a first surface and a second surface opposing the first surface; and disposing a package module, a first electronic component and a second electronic component on the first surface of the first carrying structure, wherein the package module and the first electronic component are electrically connected to the first circuit layer, and the second electronic component is stacked on and electrically connected to the first electronic component.

In an embodiment, the package module comprises: a second carrying structure having a second circuit layer and disposed on the first surface of the first carrying structure via a plurality of conductors that are electrically connected to the first circuit layer and the second circuit layer; at least one functional electronic component disposed on the second carrying structure and electrically connected to the second circuit layer; and a package layer encapsulating the functional electronic component. In another embodiment, the first circuit layer and the second circuit layer have different circuit specification. In yet another embodiment, the first circuit layer has a greater line width/line pitch than the second circuit layer.

In an embodiment, the first electronic component is electrically connected to the first circuit layer via bonding wires.

In an embodiment, the second electronic component is electrically connected to the first electronic component via conductive bumps.

In an embodiment, the method further comprises forming an encapsulation layer on the first surface of the first carrying structure, and encapsulating the first electronic component and the second electronic component with the encapsulation layer. In another embodiment, a portion of a surface of the second electronic component is exposed from the encapsulation layer. In yet another embodiment, the encapsulation layer further encapsulates the package module.

In an embodiment, the method further comprises forming a plurality of conductive elements on the second surface of the first carrying structure and electrically connecting the plurality of conductive elements to the first circuit layer.

In the electronic package and the method for fabricating the same according to the present disclosure, the second electronic component is stacked with the first electronic component, so as to reduce the area of the first and second electronic components that occupies the first surface of the first carrying structure. Compared with the prior art, the electronic package according to the present disclosure has a larger space to accommodate package modules, and an electronic product having the electronic package has a volume reduced and meets the trend of low profile and compact size.

In an embodiment, the first circuit layer and the second circuit layer have different circuit specification, and a micronized functional electronic component can be electrically connected to the first circuit layer via the second circuit layer.

In the method for fabricating an electronic package according to the present disclosure, the first circuit layer is fabricated to have a line width/line pitch needed by power contacts and ground contacts. Therefore, the first electronic component can be electrically connected to the first circuit layer, and there is no need to fabricate all of the circuits to have the same line width/line pitch as the second circuit layer. Compared with the prior art, the method for fabricating an electronic package according to the present disclosure costs less.

In an embodiment, the active surface of the first electronic component is electrically connected to an active surface of the second electronic component. Therefore, an electric transmission path is shortened. Compared with the prior art, the electronic package according to the present disclosure has a greater signal transmission speed.

BRIEF DESCRIPTION OF THE DRAWINGS

FIG. 2C' is a cross-sectional view of another fabrication process of FIG. 2C.

FIGS. 2E' and 2E" are cross-sectional views of other embodiments of FIG. 2E.

DETAILED DESCRIPTION

The following illustrative embodiments are provided to illustrate the present disclosure, these and other advantages and effects can be apparently understood by those in the art after reading the disclosure of this specification. The present disclosure can also be performed or applied by other different embodiments. The details of the specification may be on the basis of different points and applications, and numerous modifications and variations can be devised without departing from the spirit of the present disclosure.

The terminology used herein is for the purpose of describing particular devices and methods and is not intended to be limiting of this disclosure. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of stated features, integers, steps, operations, elements, and/or components, but do not preclude the presence or addition of one or more other features, integers, steps, operations, elements, components, and/or groups thereof.

FIGS. 2A to 2E are cross-sectional views of a method for fabricating an electronic package 2 according to the present disclosure.

Figure 2A:
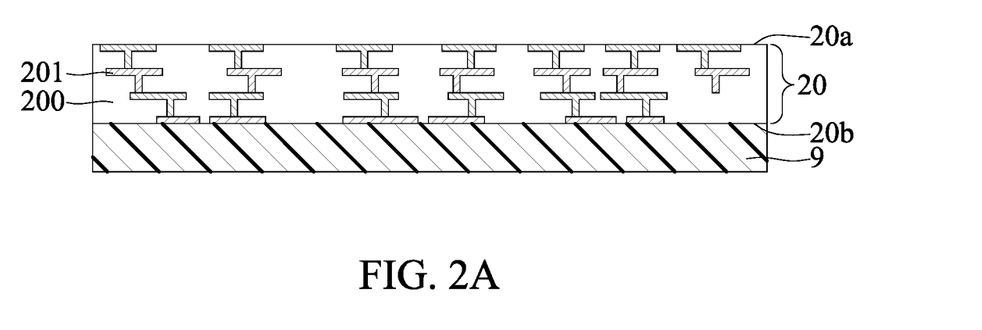
FIGS. 2A to 2E are cross-sectional views illustrating a method for fabricating an electronic package according to the present disclosure.

As shown in FIG. 2A, a first carrying structure 20 is provided. In an embodiment, the first carrying structure 20 is disposed on a support member 9.

In an embodiment, the first carrying structure 20 is a panel type of a substrate including a plurality of substrate units. In another embodiment, the first carrying structure 20 is a package substrate having a core layer and a circuit structure or a coreless circuit structure, and has a first surface 20a and a second surface 20b opposing the first surface 20a. The circuit structure comprises at least one insulation layer 200 and at least one first circuit layer 201 bonded to the insulation layer 200, such as at least one fan out redistribution layer (RDL). In another embodiment, the first carrying structure 20 is a lead frame, a wafer or a carrying board having metal routing.

In an embodiment, the first carrying structure 20 is fabricated in various processes. In another embodiment, the circuit layer is formed in a wafer fabricating process, and silicon nitride or silicon oxide is formed in a chemical vapor deposition (CVD) process to act as the insulation layer. In yet another embodiment, the circuit layer is formed in a non-wafer fabricating process, and a low cost macromolecule dielectric material is employed to act as the insulation layer, such as polyimide (PI), polybenzoxazole (PBO), prepreg (PP), a molding compound, and a photosensitive dielectric layer, which are applied and formed.

In an embodiment, the first circuit layer 201 has a line width/line pitch (L/S) greater than 2 μm.

In an embodiment, the support member 9 is a glass board, a wafer board, or other suitable board bodies.

Figure 2B:
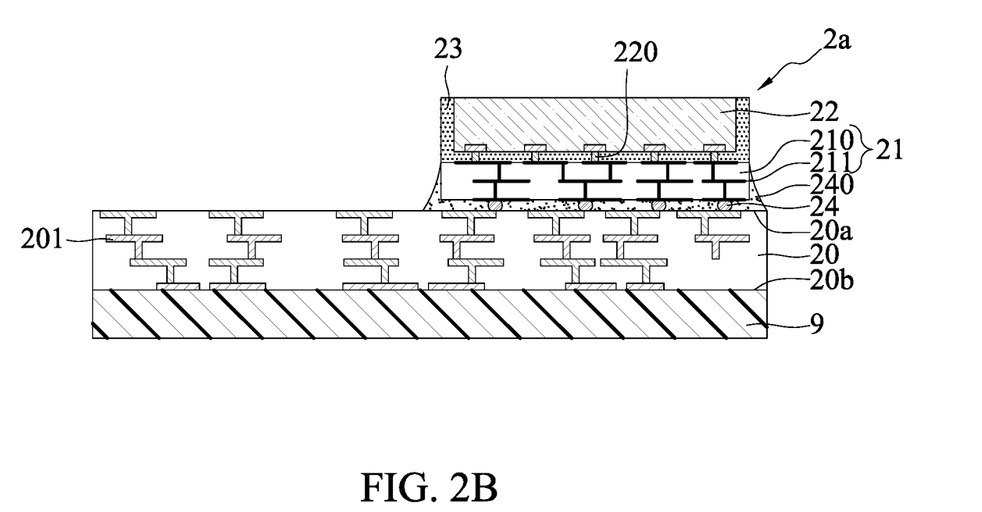

As shown in FIG. 2B, a package module 2a is disposed on the first surface 20a of the first carrying structure 20 and electrically connected to the first circuit layer 201.

In an embodiment, the package module 2a comprises a second carrying structure 21, at least one functional electronic component 22 disposed on the second carrying structure 21, and a package layer 23 encapsulating the functional electronic component 22. The second carrying structure 21 is disposed on the first surface 20a of the first carrying structure 20 via a plurality of conductors 24 and electrically connected to the first circuit layer 201 via the conductors 24.

In an embodiment, the second carrying structure 21 is a package substrate having a core layer and a circuit structure or a coreless circuit structure, and includes insulators 210 and a second circuit layer 211 (e.g., at least one fan out RDL) bonded to the insulators 210. In another embodiment, the second carrying structure 21 is a lead frame, a wafer, or a carrying board having metal routing. In an embodiment, the second carrying structure 21 can be fabricated in various fabrication processes, the circuit layer is formed in a wafer fabricating process, and silicon nitride or silicon oxide is formed in a CVD process to act as the insulation layer. In yet another embodiment, the circuit layer is formed by a general non-wafer fabricating process, and a low cost macromolecule dielectric material is employed to act as the insulation layer, such as polyimide (PI), polybenzoxazole (PBO), prepreg (PP), a molding compound, and a photosensitive dielectric layer, which are applied and formed.

In an embodiment, the first circuit layer 201 and the second circuit layer 211 have different circuit specification. In an embodiment, the second circuit layer 211 is formed in a RDL fabricating process and has a line width/line pitch less than or equal to 2 μm. In another embodiment, the first circuit layer 201 has a greater line width/line pitch than the second circuit layer 211.

In an embodiment, the functional electronic component 22 is an active element, such as a semiconductor chip, a passive element, such as a resistor, a capacitor and an inductor, or a combination thereof. In another embodiment, the functional electronic component 22 is a semiconductor chip, and is disposed in a flip-chip manner via a plurality of conductive bumps 220, such as a solder material and metal pillars, on an upper side of the second carrying structure 21 and electrically connected to the second circuit layer 211. In yet another embodiment, the functional electronic component 22 is electrically connected to the second circuit layer 211 by a plurality of bonding wires in a wire bonding manner. In still another embodiment, the functional electronic component 22 is in direct contact with the second circuit layer 211.

The package layer 23 further encapsulates the conductive bumps 220. In an embodiment, the package layer 23 is made of an insulation material, such as PI, a dry film, a molding compound, such as epoxy, or a molding material, and is formed on the second carrying structure 21 by lamination, coating or molding. In another embodiment, the package layer 23 protrudes from (as shown in FIG. 2B) or covers (not shown) the functional electronic component 22.

In an embodiment, the conductors 24 are metal bumps, such as copper pillars, a solder material, metal pins or other conductive structures, and disposed on a lower side of the second carrying structure 21. A bonding material, 240, such as an underfill, is formed between the first carrying structure 20 and the second carrying structure 21, to encapsulate the conductors 24 and fix the package module 2a.

Figure 2C:
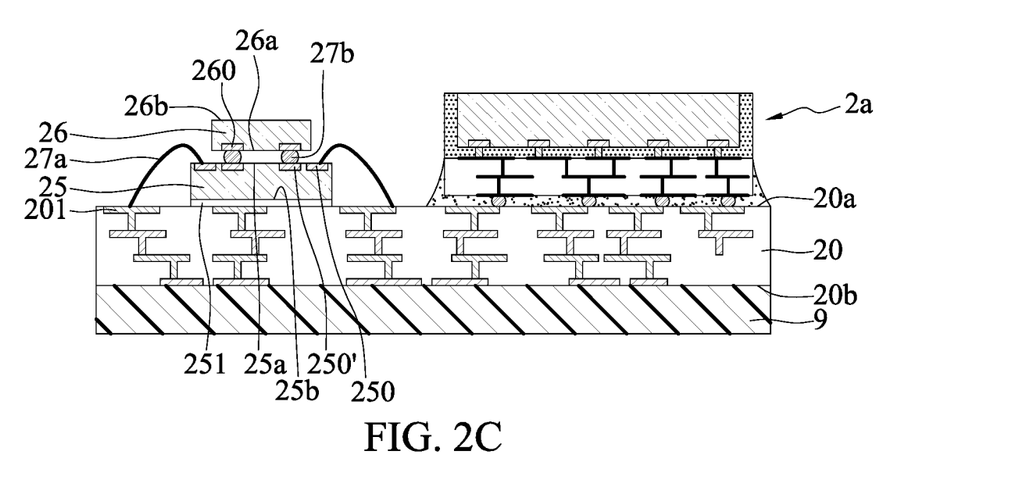

As shown in FIG. 2C, a first electronic component 25 and a second electronic component 26 are disposed on the first surface 20a of the first carrying structure 20.

In an embodiment, the second electronic component 26 is stacked on the first electronic component 25.

In an embodiment, the first electronic component 25 is an active element, such as a semiconductor chip, a passive element, such as a resistor, a capacitor and an inductor, or a combination thereof. In another embodiment, the first electronic component 25 is a semiconductor chip, and has an active surface 25a and an inactive surface 25b opposing the active surface 25a. The inactive surface 25b is adhered to the first surface 20a of the first carrying structure 20 via an adhesive material 251. Portions of electrode pads 250 disposed on the active surface 25a are electrically connected to the first circuit layer 201 via a plurality of solder wires 27a in a wire bonding manner.

In an embodiment, the second electronic component 26 is an active element, such as a semiconductor chip, a passive element, such as a resistor, a capacitor and an inductor, or a combination thereof. In another embodiment, the second electronic component 26 is a semiconductor chip, and has an active surface 26a and an inactive surface 26b opposing the active surface 26a. The active surface 26a is disposed on the active surface 25a of the first electronic component 25. Electrode pads 260 are electrically connected to other electrode pads 250' of the first electronic component 25 via a plurality of conductive bumps 27b in a flip-chip manner. In another embodiment, the electrode pads 260 of the second electronic component 26 are in direct contact with the electrode pads 250' of the first electronic component 25, without any conductive bumps.

Therefore, the second electronic component 26 is stacked with the first electronic component 25 with the active surface 25a connected to the active surface 26a.

The first electronic component 25 and the second electronic component 26 can be disposed in various manners. As shown in FIG. 2C', the first electronic component 25 and the second electronic component 26 are bonded to each other and then disposed on the first carrying structure 20, and then a wire bonding process is performed. In another embodiment, the first electronic component 25 and the second electronic component 26 are disposed sequentially, and a wire bonding process is performed before or after the second electronic component 26 is disposed.

In an embodiment, the first electronic component 25 is electrically connected to the first circuit layer 201 in a flip-chip manner, and the second electronic component 26 is electrically connected to the first electronic component 25 in a wire bonding manner.

In an embodiment, any number and type of electronic components are disposed on the first surface 20a and second surface 20b of the first carrying structure 20 in any manner, to improve the electric performance.

In an embodiment, the package module 2a, the first electronic component 25 and the second electronic component 26 can be disposed in any order.

Figure 2D:
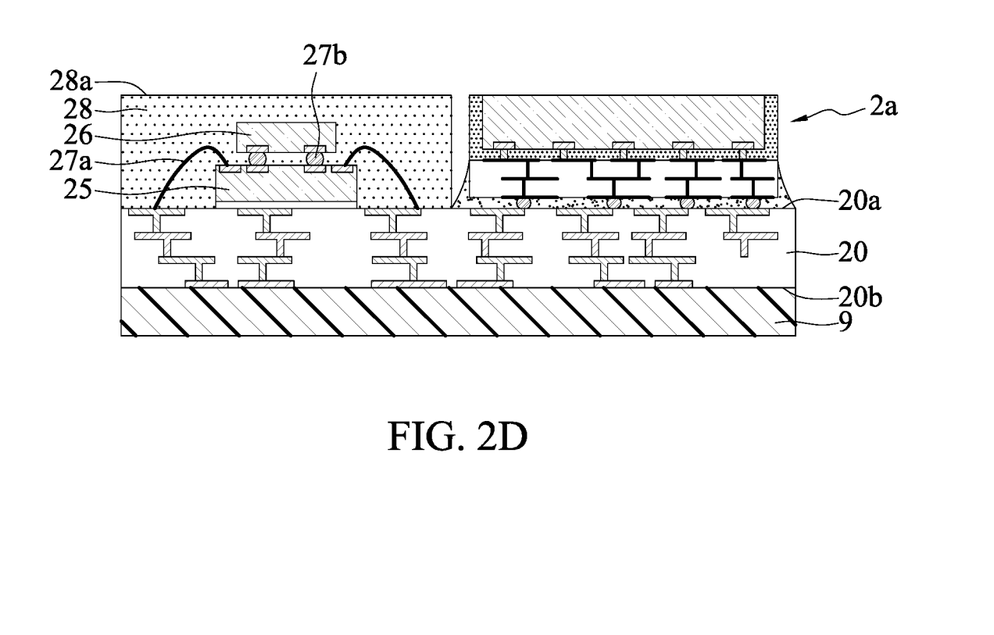

As shown in FIG. 2D, an encapsulation layer 28 is formed on the first surface 20a of the first carrying structure 20 and encapsulates the first electronic component 25, the second electronic component 26, the bonding wires 27a and the conductive bumps 27b.

In an embodiment, the encapsulation layer 28 is in contact with the first surface 20a of the first carrying structure 20, and is made of an insulation material, such as PI, a molding compound, such as epoxy, or a molding material, by molding.

The encapsulation layer 28 and the package layer 23 are made of the same or different materials.

The second electronic component 26 is not exposed from a surface 28a of the encapsulation layer 28. A portion of the encapsulation layer 28 can be removed, to exposed the inactive surface 26b of the second electronic component 26. In an embodiment, a leveling process, such as a polishing method, is used to remove a portion of the encapsulation layer 28, allowing the inactive surface 26b of the second electronic component 26 to be flush with the surface 28a of the encapsulation layer 28, such as the electronic package 2' shown in FIG. 2E'. In another embodiment, the surface 28a of the encapsulation layer 28 is drilled by laser to form a plurality of holes exposing the second electronic component 26. In yet another embodiment, after a portion of the encapsulation layer 28 is removed, the inactive surface 26b of the second electronic component 26 protrudes from the surface 28a of the encapsulation layer 28. Since the package module 2a has been configured with the package layer 23, the encapsulation layer 28 does not encapsulate the package module 2a. In another embodiment, as shown in FIG. 2E'', the encapsulation layer 28 encapsulates the package module 2a.

Figure 2E:
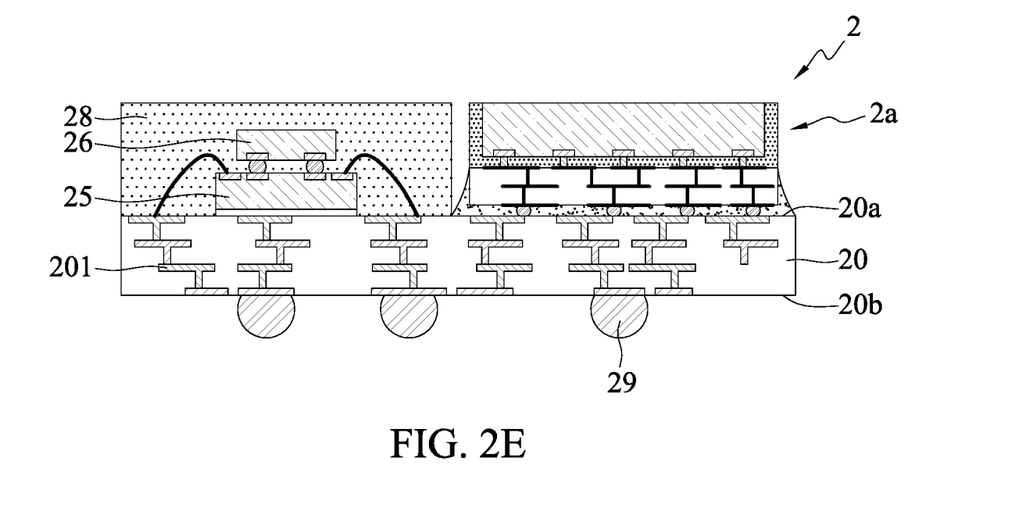

As shown in FIG. 2E, the support member 9 is removed, to expose the second surface 20b of the first carrying structure 20. A singulation process is performed, to obtain the electronic package 2 and form a plurality of conductive elements 29 on the second surface 20b of the first carrying structure 20, allowing an electronic device, such as a circuit board (not shown), to be mounted on the electronic package 2.

In an embodiment, the conductive elements 29 are electrically connected to the first circuit layer 201 of the first carrying structure 20. The conductive elements 29 are metal pillars, such as copper pillars, metal bumps encapsulating insulation blocks, solder balls, and solder balls having Cu core balls, and are cylindrical, oval-shaped or polygonal pillars.

In the method for fabricating the electronic package 2, 2', 2'' according to the present disclosure, the second electronic component 26 is stacked with the first electronic component 25, to reduce the area of the first and second electronic components that occupies the first surface 20a of the first carrying structure 20. Compared with the prior art, the electronic package 2, 2', 2" according to the present disclosure has enough space to accommodate the package module 2a or other discrete components (not shown), and reduces the volume of an electronic product including the electronic package 2, 2'. Therefore, the electronic product meets the trend of low profile and compact size.

By performing the fan out RDL process twice (i.e., the first circuit layer 201 and the second circuit layer 211), a micronized chip (i.e., a micronized functional electronic component 22) can be electrically connected to the first circuit layer 201 via the second circuit layer 211.

In the method for fabricating an electronic package according to the present disclosure, the first circuit layer 201 is fabricated to have a line width/line pitch needed for power contacts and ground contacts. Therefore, the first electronic component 25 can be electrically connected to the first circuit layer 201 (the line width/line pitch is 2-10 μm), and there is no need to fabricate all circuits to have the line width/line pitch of the second circuit layer 211 (within 2 μm). Compared with the prior art, in which all circuit layers have a line width/line pitch within 2 μm, the present disclosure is fabricated with a lower cost.

The first electronic component 25 and the second electronic component 26 are electrically connected to each other with the active surface 25a bonded to the active surface 26a, to shorten the electric transmission path. Compared with the prior art, the electronic package 2, 2', 2" according to the present disclosure has a greater signal transmission speed.

The present disclosure further provides an electronic package 2, 2', 2", which comprises a first carrying structure 20 having a first circuit layer 201, a package module 2a, a first electronic component 25 and a second electronic component 26.

The first carrying structure 20 is defined with a first surface 20a and a second surface 20b opposing the first surface 20a.

The package module 2a is disposed on the first surface 20a of the first carrying structure 20 and electrically connected to the first circuit layer 201. The package module 2a comprises: a second carrying structure 21 having a second circuit layer 211 and disposed on the first surface 20a of the first carrying structure 20 via a plurality of conductors 24 that are electrically connected to the first circuit layer 201 and the second circuit layer 211; at least one functional electronic component 22 disposed on the second carrying structure 21 and electrically connected to the second circuit layer 211; and a package layer 23 encapsulating the functional electronic component 22.

The first electronic component 25 is disposed on the first surface 20a of the first carrying structure 20 and electrically connected to the first circuit layer 201.

The second electronic component 26 is stacked on and electrically connected to the first electronic component 25.

In an embodiment, the first circuit layer 201 and the second circuit layer 211 have different circuit specification.

In an embodiment, the first circuit layer 201 has a greater line width/line pitch than the second circuit layer 211.

In an embodiment, the first electronic component 25 is electrically connected to the first circuit layer 201 via a plurality of bonding wires 27a.

In an embodiment, the second electronic component 26 is electrically connected to the first electronic component 25 via a plurality of conductive bumps 27b.

In an embodiment, the electronic package 2, 2', 2" further comprises an encapsulation layer 28 formed on the first surface 20a of the first carrying structure 20 and encapsulates the first electronic component 25 and the second electronic component 26. The inactive surface 26b of the second electronic component 26 of the electronic package 2' is exposed from the encapsulation layer 28. In another embodiment, the encapsulation layer 28 further encapsulates the package module 2a.

In an embodiment, the electronic package 2, 2', 2" further comprises a plurality of conductive elements 29 formed on the second surface 20b of the first carrying structure 20 and electrically connected to the first circuit layer 201.

In the electronic package and the method for fabricating the same according to the present disclosure, the second electronic component is stacked with the first electronic component, to reduce the area of the first and second electronic components that occupies the first surface of the first carrying structure. Compared with the prior art, the electronic package according to the present disclosure has a larger space to accommodate package modules, and an electronic product having the electronic package has a volume reduced and meets the trend of low profile and compact size.

In an embodiment, the first circuit layer and the second circuit layer have different circuit specification, and a micronized functional electronic component can be electrically connected to the first circuit layer via the second circuit layer.

In the method for fabricating an electronic package according to the present disclosure, the first circuit layer is fabricated to have a line width/line pitch needed by power contacts and ground contacts. Therefore, the first electronic component can be electrically connected to the first circuit layer, and there is no need to fabricate all of the circuits to have the same line width/line pitch as the second circuit layer. Compared with the prior art, the method for fabricating an electronic package according to the present disclosure costs less.

In an embodiment, the active surface of the first electronic component is electrically connected to the active surface of the second electronic component. Therefore, an electric transmission path is shortened. Compared with the prior art, the electronic package according to the present disclosure has a greater signal transmission speed.

The foregoing descriptions of the detailed embodiments are illustrated to disclose the features and functions of the present disclosure and not restrictive of the scope of the present disclosure. It should be understood to those in the art that all modifications and variations according to the spirit and principle in the present disclosure should fall within the scope of the appended claims.

What is claimed is:

1. An electronic package, comprising:
a first carrying structure defined with a first surface and a second surface opposing the first surface and having a first circuit layer;
a package module disposed on the first surface of the first carrying structure and electrically connected to the first circuit layer;
a first electronic component disposed on the first surface of the first carrying structure and electrically connected to the first circuit layer, wherein the first electronic component has a first active surface and a first inactive surface opposing the first active surface, the first inactive surface is adhered to the first surface of the first carrying structure, and a plurality of first electrode pads are disposed on the first active surface; and a second electronic component stacked on and electrically connected to the first electronic component, wherein the second electronic component has a second active surface and a second inactive surface opposing the second active surface, the second active surface is disposed on the first active surface of the first electronic component, and a plurality of second electrode pads are disposed on the second active surface and electrically connected to the first electrode pads of the first electronic component.

2. The electronic package of claim 1, wherein the package module comprises:
 a second carrying structure having a second circuit layer and disposed on the first surface of the first carrying structure via a plurality of conductors electrically connected to the first circuit layer and the second circuit layer;
 at least one functional electronic component disposed on the second carrying structure and electrically connected to the second circuit layer; and
 a package layer encapsulating the functional electronic component.

3. The electronic package of claim 2, wherein the first circuit layer and the second circuit layer have different circuit specification.

4. The electronic package of claim 2, wherein the first circuit layer has a greater line width/line pitch than the second circuit layer.

5. The electronic package of claim 1, wherein the first electronic component is electrically connected to the first circuit layer via bonding wires.

6. The electronic package of claim 1, wherein the second electronic component is electrically connected to the first electronic component via conductive bumps.

7. The electronic package of claim 1, further comprising an encapsulation layer formed on the first surface of the first carrying structure and encapsulating the first electronic component and the second electronic component.

8. The electronic package of claim 7, wherein a portion of a surface of the second electronic component is exposed from the encapsulation layer.

9. The electronic package of claim 7, wherein the encapsulation layer further encapsulates the package module.

10. The electronic package of claim 1, further comprising a plurality of conductive elements formed on the second surface of the first carrying structure and electrically connected to the first circuit layer.

11. A method for fabricating an electronic package, comprising:
 providing a first carrying structure having a first circuit layer and defined with a first surface and a second surface opposing the first surface; and
 disposing a package module, a first electronic component and a second electronic component on the first surface of the first carrying structure, wherein the package module and the first electronic component are electrically connected to the first circuit layer, and the second electronic component is stacked on and electrically connected to the first electronic component,
 wherein the first electronic component has a first active surface and a first inactive surface opposing the first active surface, the first inactive surface is adhered to the first surface of the first carrying structure, and a plurality of first electrode pads are disposed on the first active surface, and
 wherein the second electronic component has a second active surface and a second inactive surface opposing the second active surface, the second active surface is disposed on the first active surface of the first electronic component, and a plurality of second electrode pads are disposed on the second active surface and electrically connected to the first electrode pads of the first electronic component.

12. The method of claim 11, wherein the package module comprises:
 a second carrying structure having a second circuit layer and disposed on the first surface of the first carrying structure via a plurality of conductors electrically connected to the first circuit layer and the second circuit layer;
 at least one functional electronic component disposed on the second carrying structure and electrically connected to the second circuit layer; and
 a package layer encapsulating the functional electronic component.

13. The method of claim 12, wherein the first circuit layer and the second circuit layer have different circuit specification.

14. The method of claim 12, wherein the first circuit layer has a greater line width/line pitch than the second circuit layer.

15. The method of claim 11, wherein the first electronic component is electrically connected to the first circuit layer via bonding wires.

16. The method of claim 11, wherein the second electronic component is electrically connected to the first electronic component via conductive bumps.

17. The method of claim 11, further comprising forming an encapsulation layer on the first surface of the first carrying structure, and encapsulating the first electronic component and the second electronic component with the encapsulation layer.

18. The method of claim 17, wherein a portion of a surface of the second electronic component is exposed from the encapsulation layer.

19. The method of claim 17, wherein the encapsulation layer further encapsulates the package module.

20. The method of claim 11, further comprising forming a plurality of conductive elements on the second surface of the first carrying structure and electrically connecting the plurality of conductive elements to the first circuit layer.

* * * * *